US012669382B2

(12) United States Patent
Kim et al.

(10) Patent No.: US 12,669,382 B2
(45) Date of Patent: Jun. 30, 2026

(54) SUBSTRATE TEMPERATURE MEASURING DEVICE, SUBSTRATE PROCESSING APPARATUS INCLUDING THE SAME, AND SUBSTRATE TEMPERATURE MEASURING METHOD USING THE SAME

(71) Applicant: SAMSUNG ELECTRONICS CO., LTD., Suwon-si (KR)

(72) Inventors: Yeon Tae Kim, Suwon-si (KR); Hun Yong Park, Suwon-si (KR); Yihwan Kim, Suwon-si (KR); Ji Hoon Kim, Suwon-si (KR); Kee Soo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 18/198,482

(22) Filed: May 17, 2023

(65) Prior Publication Data

US 2024/0019311 A1    Jan. 18, 2024

(30) Foreign Application Priority Data

Jul. 13, 2022    (KR) ........................ 10-2022-0086326

(51) Int. Cl.
*G01K 1/02* (2021.01)
*G01J 5/00* (2022.01)
(Continued)

(52) U.S. Cl.
CPC ............ *G01K 1/026* (2013.01); *G01J 5/0003* (2013.01); *G01J 5/08* (2013.01); *G01J 5/0801* (2022.01);
(Continued)

(58) Field of Classification Search
CPC ....... G01K 1/026; G01K 11/12; G01J 5/0003; G01J 5/08; G01J 5/0801; G01J 5/53;
(Continued)

(56) References Cited

U.S. PATENT DOCUMENTS 4,924,478 A * 5/1990 Tank ........................ G01J 5/602
                                                        702/135
5,326,172 A * 7/1994 Ng ........................ G01J 5/0806
                                                        250/339.04
(Continued)

FOREIGN PATENT DOCUMENTS

| JP | 1993-142051 A | 6/1993 |
| JP | 6485953 B2 | 3/2019 |
| KR | 10-2015-0107090 A | 9/2015 |

OTHER PUBLICATIONS

Cashdollar, Applied Optics, vol. 18 (15), Aug. 1, 1979.

*Primary Examiner* — Laura Martin
*Assistant Examiner* — Philip L Cotey
(74) *Attorney, Agent, or Firm* — Muir Patent Law, PLLC

(57) ABSTRACT

A substrate temperature measuring device includes a sensor which senses a first amount of light of a first light having a first wavelength, a second amount of light of a second light having a second wavelength, and a third amount of light of a third light having a third wavelength provided from a substrate, a first calculator to calculate a first temperature for the first wavelength, a second temperature for the second wavelength, and a third temperature of the wavelength through the first amount of light, the second amount of light and the third amount of light which are sensed, and a second calculator to calculate emissivity of the substrate and reflected energy of the substrate through the first temperature, the second temperature, and the third temperature, (Continued)

wherein a temperature of the substrate is calculated through the calculated emissivity of the substrate and the reflected energy of the substrate.

20 Claims, 15 Drawing Sheets

(51) Int. Cl.

| | |
|---|---|
| *G01J 5/08* | (2022.01) |
| *G01J 5/0801* | (2022.01) |
| *G01J 5/53* | (2022.01) |
| *G01K 11/12* | (2021.01) |
| *H10P 72/00* | (2026.01) |
| *G01J 5/02* | (2022.01) |
| *G01J 5/80* | (2022.01) |

(52) U.S. Cl.
CPC .............. *G01J 5/53* (2022.01); *G01K 11/12* (2013.01); *H10P 72/0602* (2026.01); *G01J 5/0007* (2013.01); *G01J 2005/0074* (2013.01); *G01J 5/026* (2013.01); *G01J 5/0814* (2022.01); *G01J 5/80* (2022.01)

(58) Field of Classification Search
CPC ........ G01J 5/0007; G01J 5/026; G01J 5/0814; G01J 5/80; G01J 2005/0074; H01L 21/67248
See application file for complete search history.

(56) References Cited

U.S. PATENT DOCUMENTS

| | | | | |
|---|---|---|---|---|
| 5,564,830 | A * | 10/1996 | Bobel | G01J 5/0805 |
| | | | | 702/170 |
| 6,299,346 | B1 * | 10/2001 | Ish-Shalom | G01J 5/60 |
| | | | | 374/134 |
| 6,398,406 | B1 * | 6/2002 | Breiland | G01J 5/52 |
| | | | | 374/126 |
| 8,696,197 | B2 * | 4/2014 | Timans | H10P 72/0436 |
| | | | | 250/341.8 |
| 9,335,219 | B2 * | 5/2016 | Stein | G01J 5/602 |
| 9,386,632 | B2 * | 7/2016 | Ji | H05B 1/0233 |
| 2009/0200279 | A1 * | 8/2009 | Li | G01J 5/02 |
| | | | | 374/126 |
| 2010/0246631 | A1 * | 9/2010 | Barlett | G01J 5/60 |
| | | | | 374/2 |
| 2010/0256945 | A1 * | 10/2010 | Murata | G01J 5/0003 |
| | | | | 702/179 |
| 2010/0290500 | A1 * | 11/2010 | Zettler | G01J 5/08 |
| | | | | 374/2 |
| 2012/0327970 | A1 * | 12/2012 | Haw | G01J 5/06 |
| | | | | 374/121 |
| 2015/0181649 | A1 * | 6/2015 | Ji | H05B 1/0233 |
| | | | | 219/502 |
| 2019/0084092 | A1 * | 3/2019 | Bocksrocker | B23K 26/034 |
| 2020/0269267 | A1 * | 8/2020 | Bessant | A24F 40/51 |
| 2020/0292390 | A1 * | 9/2020 | Perrot | G01J 5/0814 |
| 2023/0377915 | A1 * | 11/2023 | Wang | H10P 72/0436 |
| 2025/0155291 | A1 * | 5/2025 | Heydhausen | G01J 5/0003 |

* cited by examiner

SUBSTRATE TEMPERATURE MEASURING DEVICE, SUBSTRATE PROCESSING APPARATUS INCLUDING THE SAME, AND SUBSTRATE TEMPERATURE MEASURING METHOD USING THE SAME

CROSS-REFERENCE TO RELATED APPLICATION

This application claims priority from Korean Patent Application No. 10-2022-0086326, filed on Jul. 13, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a substrate temperature measuring device, a substrate processing apparatus including the same, and a substrate temperature measuring method using the same.

2. Description of the Related Art

As semiconductor elements and the like become more and more highly integrated, sizes of various patterns forming each element are further miniaturized. In contrast to the trend toward miniaturization of the semiconductor element patterns, the size of semiconductor wafers becomes larger from the viewpoint of improving productivity. Since the size of substrates, e.g., semiconductor wafers, and photomasks becomes larger despite miniaturization of the patterns, the importance of evenly forming and managing the element patterns repeatedly formed inside the enlarged semiconductor wafer or photomask is gradually increasing.

Strict management of factors, e.g., a substrate temperature, is required to form uniform and minute patterns. For example, evaluating warpage and temperature of the substrate at each step of the process and implementing uniform process conditions according to the warpage and temperature of the substrate are important factors in improving the semiconductor fabrication yield.

SUMMARY

According to an aspect of the present disclosure, there is provided a substrate temperature measuring device including, a sensor unit which senses a first amount of light of a first light having a first wavelength, a second amount of light of a second light having a second wavelength, and a third amount of light of a third light having a third wavelength which are provided from a substrate, a first calculation unit which calculates a first temperature for the first wavelength, a second temperature for the second wavelength, and a third temperature of the wavelength through the first amount of light, the second amount of light and the third amount of light which are sensed, and a second calculation unit which calculates emissivity of the substrate and reflected energy of the substrate through the first temperature, the second temperature, and the third temperature, wherein a temperature of the substrate is calculated through the calculated emissivity of the substrate and the reflected energy of the substrate.

According to another aspect of the present disclosure, there is provided a substrate processing apparatus including, a chamber which defines a processing space for processing a substrate, a temperature measuring unit which is installed on an upper wall of the chamber to measure a temperature of the substrate, and a light source unit which is provided on an inner wall of the chamber, wherein the temperature measuring unit includes a sensor unit which senses a first amount of light of a first light having a first wavelength, a second amount of light of a second light having a second wavelength, and a third amount of light of a third light having a third wavelength, which are provided from the substrate, the first wavelength, the second wavelength, and the third wavelength being different from each other and each 1 μm or more and 2 μm or less, an optical system which makes an optical axis of the sensor match an optical plane, a first calculation unit which calculates a first temperature for the first wavelength, a second temperature for the second wavelength, and a third temperature of the wavelength through the first amount of light, the second amount of light and the third amount of light which are sensed, and a second calculation unit which calculates emissivity of the substrate and reflected energy of the substrate through the first temperature, the second temperature, and the third temperature, wherein a temperature of the substrate is calculated through the calculated emissivity of the substrate and the reflected energy of the substrate, the first to third amounts of light each include an amount of emitted light emitted from the substrate and an amount of reflected light of light which is provided from the light source unit and reflected from the substrate, the amount of emitted light is determined by the emissivity of the substrate, and the amount of reflected light is determined by the reflected energy of the substrate.

According to yet another aspect of the present disclosure, there is provided a substrate temperature measuring method including, providing light from a substrate, separating the light into first light having a first wavelength, second light having a second wavelength, and third light having a third wavelength, sensing a first amount of light of the first light, a second amount of light of the second light, and a third amount of light of the third light, calculating a first temperature for the first wavelength, a second temperature for the second wavelength, and a third temperature for the third wavelength, through the first amount of light, the second amount of light, and the third amount of light which are sensed, calculating emissivity of the substrate and reflected energy of the substrate through the first temperature, the second temperature, and the third temperature, and calculating a temperature of the substrate through the calculated emissivity of the substrate and the reflected energy of the substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
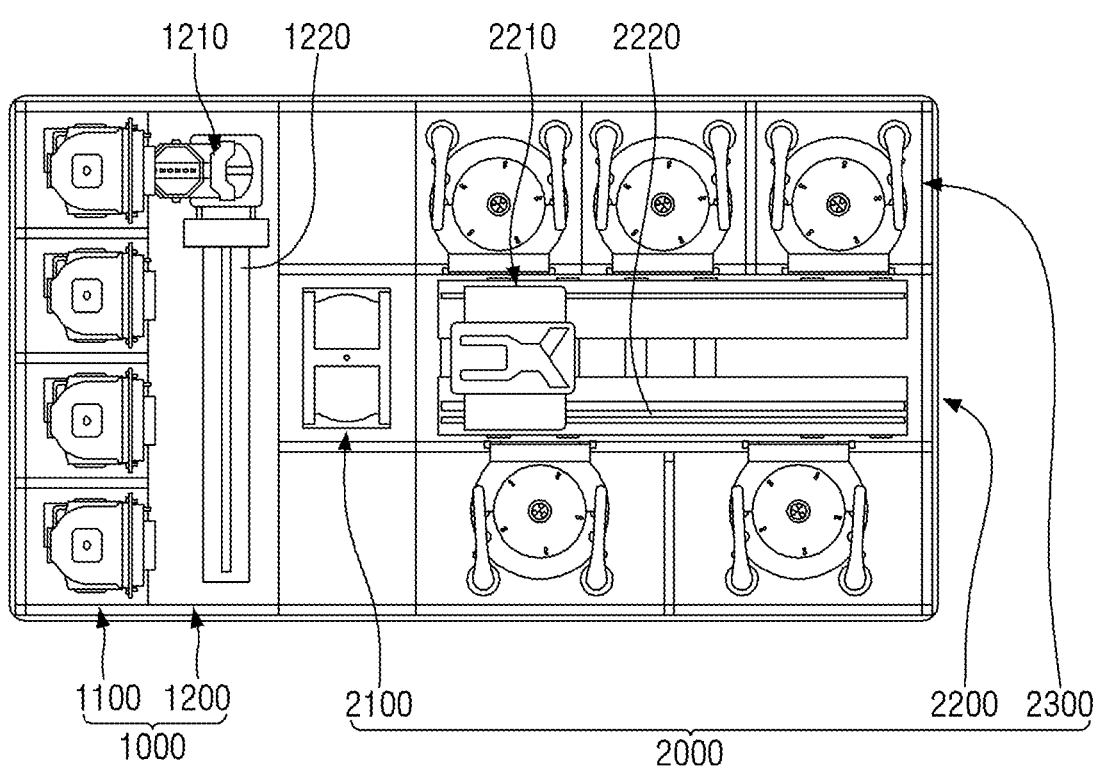
FIG. 1 is a plan view of a substrate processing system according to some embodiments of the disclosure.

A substrate processing system according to some embodiments will be described below with reference to FIG. 1. FIG. 1 is a plan view of the substrate processing system according to some embodiments of the disclosure.

Referring to FIG. 1, the substrate processing system according to some embodiments may include an index module 1000 and a process module 2000. The index module 1000 receives a substrate from the outside and transports the substrate to the process module 2000. The process module 2000 may perform a process on the substrate, e.g., at least one of a cleaning process, a deposition process, and an etching process.

The index module 1000 may be an equipment front end module (EFEM). The index module 1000 may include a load port 1100 and a transport frame 1200.

The load port 1100 may accommodate the substrate. The substrate may be placed in a container within the load port 1100. A front opening unified pod (FOUP) may be used as the container. The container may be loaded into the load port 1100 from the outside by an overhead transfer (OHT). The container may be unloaded from the load port 1100 by the overhead transfer. The transport frame 1200 may transport the substrates between the container placed on the load port 1100 and the process module 2000, e.g., via a robotic arm 1210 moving on a rail 1220.

The process module 2000 may be a module that performs a process on the process. The process module 2000 may include a buffer chamber 2100, a transfer chamber 2200, and a process chamber 2300.

The buffer chamber 2100 provides a space in which substrates transported between the index module 1000 and the process module 2000 temporarily stay. The buffer chamber 2100 may provide a buffer slot in which the substrate is placed. A transfer robot 2210 of the transfer chamber 2200 may withdraw the substrate placed in the buffer slot and transport it to the process chamber 2300. The buffer chamber 2100 may provide a plurality of buffer slots, e.g., for a plurality of substrates.

The transfer chamber 2200 transports the substrate between the buffer chamber 2100 and the process chamber 2300, e.g., a plurality of process chambers 2300 may be placed around the transfer chamber 2200. The transfer chamber 2200 may include the transfer robot 2210 and a transfer rail 2220. The transfer robot 2210 may move on the transfer rail 2220 to transport the substrate.

In some embodiments, the process chamber 2300 may be a substrate processing apparatus. For example, at least one of a cleaning process, a deposition process, and an etching process may be performed inside the process chamber 2300. For example, during a deposition process, silicon germanium (SiGe) may be deposited on the substrate inside the process chamber 2300.

A plurality of process chambers 2300 may be provided in the process module 2000. Some of the process chambers 2300 may be placed on one side of the transfer chamber 2200. Other of the process chambers 2300 may be placed on the other side of the transfer chamber 2200. For example, the plurality of process chambers 2300 may be placed to face each other on the other surface of the transfer chamber 2200, e.g., the plurality of process chambers 2300 may be arranged on opposite sides of the transfer rail 2220 of the transfer chamber 2200 to face each other. In another example, the plurality of process chambers 2300 may be placed in a row on one side of the transfer chamber 2200. The placement of the process chambers 2300 may be adjusted in consideration of a footprint of the apparatus, process efficiency, and the like.

Hereinafter, the substrate temperature measuring device and the substrate processing apparatus including the same according to some embodiments will be described with reference to FIGS. 2 to 10.

Figure 2:
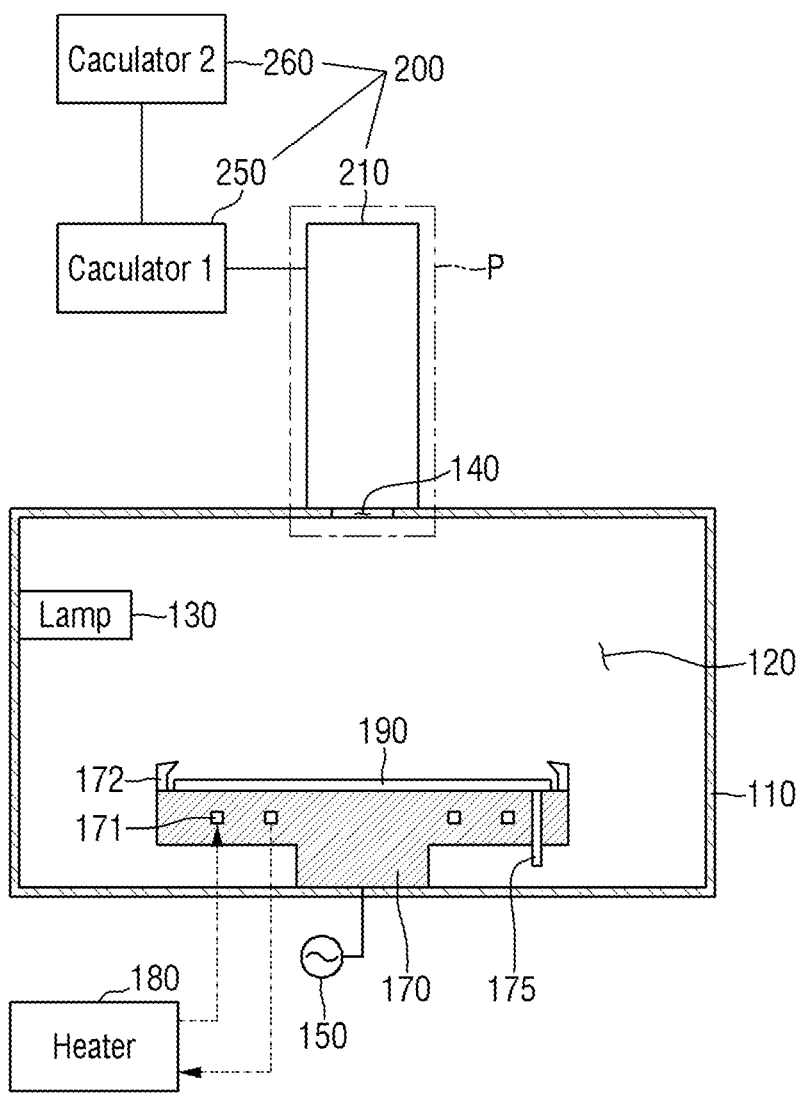
FIG. 2 is an exemplary cross-sectional view of the substrate processing apparatus of FIG. 1.
Figure 3:
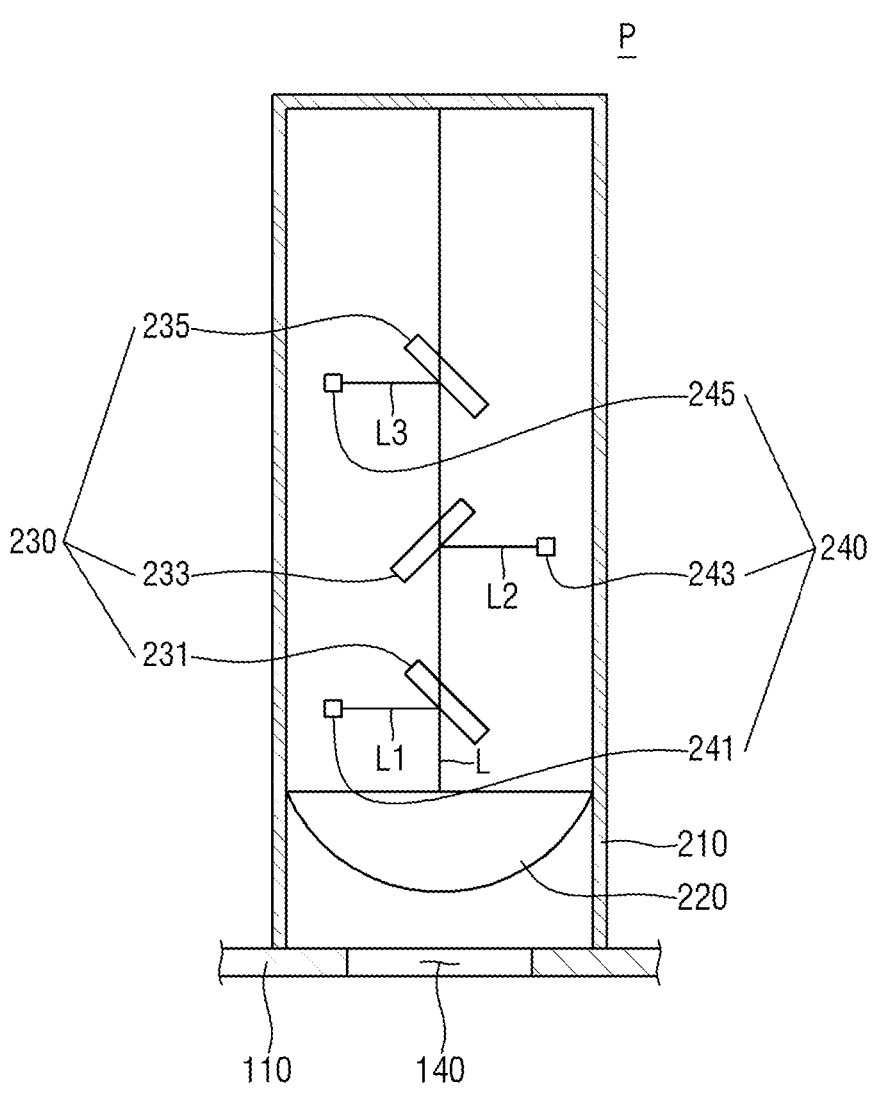
FIG. 3 is an enlarged view of a temperature measuring unit of FIG. 2.
Figure 4:
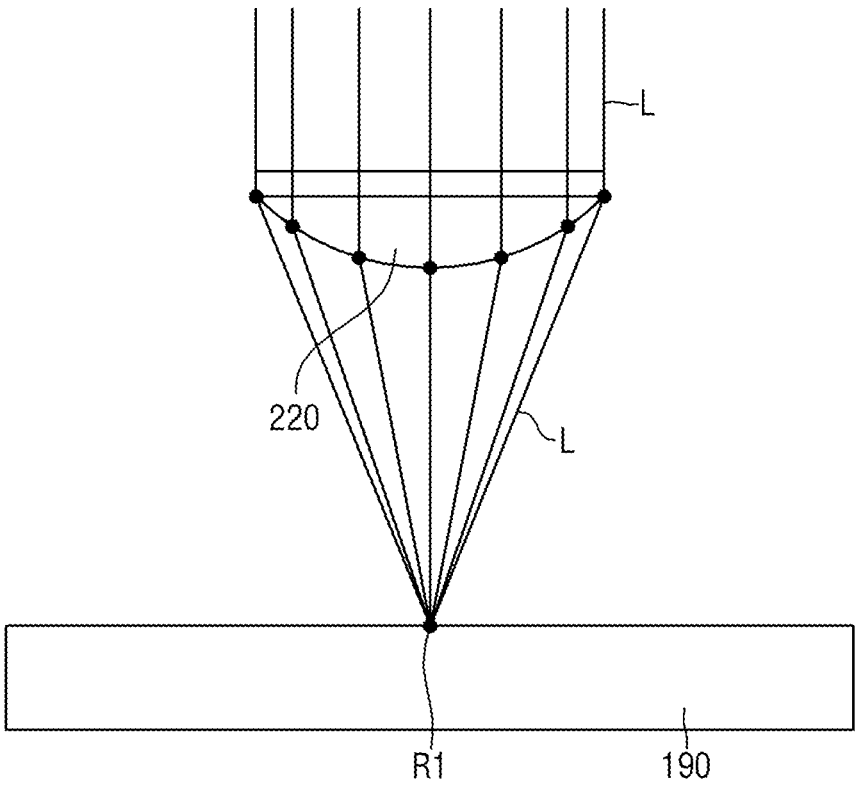
FIG. 4 is a schematic conceptual diagram of an optical system of FIG. 3.

FIG. 2 is an exemplary cross-sectional view of the substrate processing apparatus of FIG. 1 (e.g., the process chamber 2300). FIG. 3 is an enlarged view of region P of FIG. 2 illustrating a detailed view of a temperature measuring unit of FIG. 2. FIG. 4 is a schematic conceptual diagram of the optical system of FIG. 3. For reference, the temperature measuring unit may be the substrate temperature measuring device of the present disclosure.

Referring to FIG. 2, the substrate processing apparatus according to some embodiments may include a chamber 110, a light source 130, a transparent window 140, and a temperature measuring unit 200.

The substrate processing apparatus according to some embodiments may be a chamber for performing semiconductor processes, e.g., an etching process, a deposition process, and a cleaning process, on the substrate 190. For example, the substrate processing apparatus may be a deposition chamber for depositing a silicon germanium (SiGe) film on the substrate 190. Further, according to some embodiments, the temperature of the substrate 190 may be measured using the substrate processing apparatus. The temperature of the substrate 190 may be measured using the substrate temperature measuring device included in the substrate processing apparatus. The substrate temperature measuring device may be the temperature measuring unit 200 of FIG. 2, e.g., a pyrometer.

As used herein, the term "substrate" refers to the substrate itself or to a stacked structure including the substrate and a predetermined layer or film formed on the surface thereof. Also, the term "surface of the substrate" refers to an exposed surface of the substrate itself or an exposed surface of a predetermined layer or film formed on the substrate. For example, the substrate may be a wafer or may include a wafer and at least one material film on the wafer. The material film may be an insulating film and/or a conductive film formed on the wafer through various methods, e.g., deposition and/or coating plating. For example, the insulating film may include an oxide film, a nitride film, an oxynitride film, and the like, and the conductive film may include a metal film, a polysilicon film, and the like. The material film may be a single film or a plurality of films formed on the wafer. Also, the material film may be formed on a wafer to have a predetermined pattern.

The chamber 110 may define a processing space 120 in which the substrate 190 is processed. The processing space 120 may be sealed from the outside. An overall exterior structure of the chamber 110 may have a shape of, e.g., a cylindrical pillar, an elliptical pillar or a polygonal pillar. The chamber 110 may generally be formed of a metallic material. The chamber 110 may be kept in an electrically grounded state to block noise from the outside at the time of various semiconductor processes.

For example, although not shown, a liner may be provided inside the chamber 110. The liner protects the chamber 110 and may cover metal structures inside the chamber 110 to prevent an occurrence of metal contamination due to arcing inside the chamber 110. The liner may be made of a metallic material, e.g., aluminum, a ceramic material, or the like.

The light source 130, e.g., a lamp, may be provided on the inner wall of the chamber 110. The light source 130 may generate light. The light generated by the light source 130 may be irradiated toward the substrate 190. The light generated by the light source 130 may be reflected from the substrate 190. As an example, the light source 130 may be a tungsten light source. For example, the light source 130 may be installed on the inner upper wall of the chamber 110 or any other inner surface of the chamber 110 depending on the design of the substrate processing apparatus.

The transparent window 140 may be provided on the upper wall of the chamber 110. Light provided from the substrate 190 may enter the temperature measuring unit 200 through the transparent window 140. For example, as illustrated in FIG. 2, the transparent window 140 may be located at a position vertically spaced from the upper surface of the substrate 190, e.g., from the central region of the substrate 190.

The temperature measuring unit 200, i.e., a temperature measurer, may be provided on the upper wall of the chamber 110. The temperature measuring unit 200 may be provided on the outer wall of the chamber 110, e.g., the temperature measuring unit 200 may be external to the chamber 110 and positioned outside of the chamber 110.

Referring to FIG. 3, the temperature measuring unit 200 may include a body portion 210, an optical system 220, a splitter 230, and a sensor unit 240.

The body portion 210 may completely cover the transparent window 140. The body portion 210 may be made of a flame resistance material that does not deform under high heat and may block heat transfer to the internal space. Although not shown, the body portion 210 may be coupled with the chamber 110. For example, the body portion 210 and the chamber 110 may be secured by engagement members, e.g., bolts/nuts and screws.

The optical system 220 may be placed at the front end of the temperature measuring unit 200, e.g., adjacent to the transparent window 140. The optical system 220 may be placed on the transparent window 140. The optical system 220 may include at least one lens. The optical system 220 may control the traveling direction of light provided from the substrate 190 to be constant. For example, the optical system 220 may make, e.g., adjust, an optical axis of the sensor unit 240 match, e.g., be aligned with, an optical plane. Since the optical system 220 makes the optical axis of the sensor unit 240 match the optical plane, the temperature of the substrate 190 for each wavelength may be measured at one plane and one point of the substrate 190, e.g., at a same single point from a single plane of the substrate 190.

In detail, referring to FIG. 4, the substrate 190 may include a first region R1. The first region R1 may be a region corresponding to one point in one plane of the substrate 190. The light L may be provided toward the optical system 220 from the first region R1 of the substrate 190. The light L may include emitted light and reflected light. The emitted light of the substrate 190 may be light emitted from the substrate 190 itself. The reflected light may be light that is provided from an external light source and reflected by the substrate 190. The light L provided from the first region R1 may have a certain direction, while passing through the optical system 220. For example, as illustrated in FIG. 4, the light L may be incident on the optical system 220 at a certain direction, e.g., angle, and the optical system 220 may control, e.g., adjust, the traveling direction of the light L to be constant.

As an example, the optical system 220 may include a condensing lens for collecting the light L onto the temperature measuring unit 200. As another example, the optical system 220 may include a wide-angle lens for allowing the light L to be collected over a wide angle of view.

Referring to FIG. 3 again, the splitter 230 may be placed inside the body portion 210. The splitter 230 may separate the light L incident through the transparent window 140 into lights having different wavelengths from each other.

For example, the splitter 230 may include a first sub-splitter 231, a second sub-splitter 233, and a third sub-splitter 235. The first sub-splitter 231 (i.e., first sub-splitter) may separate a first light L1 having a first wavelength. The second sub-splitter 233 may separate a second light L2 having a second wavelength. A third sub-splitter 235 may separate a third light L3 having a third wavelength.

In some embodiments, the first through third wavelengths may be 1 μm or more and 2 μm or less. The first to third wavelengths may be wavelengths that are close to each other. The close wavelengths mean that a difference between the shortest wavelength and the longest wavelength among the first to third wavelengths is 1 μm or less.

The sensor unit 240, i.e., a sensor, may be placed inside the body portion 210. The sensor unit 240 may sense the amount of light L provided from the substrate 190. The amount of light L may include the amount of emitted light and the amount of reflected light. The amount of emitted light may be an amount of emitted light of the substrate 190, and the amount of reflected light may be an amount of reflected light from the substrate 190. The sensor unit 240 may sense the amount of lights separated from each splitter 230.

For example, the sensor unit 240 may include a first sub-sensor unit 241, a second sub-sensor unit 243 and a third sub-sensor unit 245, e.g., each of the first to third sub-sensor units 241 to 245 may be positioned adjacent to a corresponding one of the first to third sub-splitter 231 to 235. The first sub-sensor unit 241 (i.e., sub-sensor) may sense a first amount of light of the first light L1. The second sub-sensor unit 243 may sense a second amount of light of the second light L2. The third sub-sensor unit 245 may sense a third amount of light of the third light L3.

In some embodiments, the first to third amounts of light may each include an amount of emitted light emitted from the substrate 190 and an amount of reflected light reflected from the substrate 190. The amount of emitted light may be determined by the emissivity of the substrate 190, and the amount of reflected light may be determined by the reflectivity of the substrate 190 or the reflected energy of the substrate 190. The emissivity of the substrate 190, the reflectivity of the substrate 190, and the reflected energy of the substrate 190 may be calculated through a second calculation unit 260, which will be described below.

Referring to FIG. 2 again, the temperature measuring unit 200 may include a first calculation unit 250 and the second calculation unit 260.

The first calculation unit 250, i.e., a first calculator, may receive the first amount of light of the first light L1, the second amount of light of the second light L2, and the third amount of light of the third light L3 sensed by the sensor unit 240. The first calculation unit 250 may calculate temperatures for the first to third wavelengths on the basis of the sensed amount of light.

The first calculation unit 250 is, e.g., electrically, connected to the sensor unit 240, e.g., independently connected to each of the first to third sub-sensor units 241 to 245. The amounts of light sensed by the sensor unit 240 may be provided, e.g., output, to the first calculation unit 250. The first calculation unit 250 may calculate the temperature for each wavelength.

For example, the first amount of light of the first light L1 having the first wavelength, the second amount of light of the second light L2 having the second wavelength, and the third amount of light of the third light L3 having the third wavelength may be provided to the first calculation unit 250. The first calculation unit 250 may calculate the first temperature for the first wavelength, the second temperature for the second wavelength, and the third temperature for the third wavelength through the first amount of light, the second amount of light, and the third amount of light. When the first calculation unit 250 calculates the temperature, it is assumed that the object providing light is a black body. That is, the first temperature, the second temperature, and the third temperature may be fixed values measured with a black body.

In some embodiments, the first temperature, the second temperature, and the third temperature may be calculated according to Formula (1) below.

$$\text{Intensity} = E \times \frac{3.742 \times 10^8}{\lambda^5 \times \left[\exp^{(1.439 \times 10^4 / \lambda \times (T+273))} - 1\right]} \times \varepsilon \qquad \text{[Formula 1]}$$

In Formula (1), Intensity refers to the amount of light sensed by the sensor unit 240. Further, $\lambda$ refers to each of the separated wavelengths, $\varepsilon$ refers to the emissivity of the object that provides light, and T refers to the temperature of the object that provides light. Since the object was assumed to be a black body, $\varepsilon$ has a value of 1.

That is, the first temperature for the first wavelength may be calculated by inputting the first amount of light and the first wavelength into the above Formula (1). For example, the first temperature for the first wavelength may be calculated by inputting the first amount of light into intensity, the first wavelength into $\lambda$, and 1 into $\varepsilon$, in the above Formula (1). Similarly, a second temperature for the second wavelength may be calculated by inputting the second amount of light and the second wavelength into Formula (1) above. A third temperature for the third wavelength may be calculated by inputting the third amount of light and the third wavelength into the above Formula (1).

The second calculation unit 260, i.e., a second calculator, may be, e.g., electrically, connected to the first calculation unit 250. The first to third temperatures calculated by the first calculation unit 250 may be provided, e.g., output, to the second calculation unit 260.

The second calculation unit 260 may calculate the emissivity of the substrate 190, the reflectivity of the substrate 190, and the reflected energy of the substrate 190 through the first to third temperatures calculated by the first calculation unit 250. The temperature of the substrate 190 may be calculated through the calculated emissivity of the substrate 190, reflectivity of the substrate 190, and reflected energy of the substrate 190.

For example, the emissivity of the substrate 190, the reflectivity of the substrate 190, and the reflected energy of the substrate 190 may be calculated through Formula (2) below.

$$I_n(\lambda_n, T_n) = \varepsilon \times I(\lambda_n, T_w) + \rho_n R \qquad \text{[Formula 2]}$$

8

In Formula (2), $\varepsilon$ refers to the emissivity of the substrate 190, and $\rho_n$ refers to the reflectivity of the substrate 190, and R may be the reflected energy of the substrate 190.

In some embodiments, the reflected energy of the substrate 190 may be calculated on the basis of a Planck radiation law.

When the temperature of the substrate 190 is measured using the temperature measuring unit 200, because the temperature of the substrate 190 is measured using three or more wavelengths, the reliability of the temperature of the substrate 190 can be improved. Also, since the three or more wavelengths are close wavelengths, the difference in emissivity for each wavelength may be small. That is, the emissivity of each of the three or more wavelengths may be assumed to be the same. In this case, since the calculation of the second calculation unit 260 is further simplified, the speed of measuring and calculating the temperature of the substrate 190 can be improved.

Referring back to FIG. 2, the substrate processing apparatus according to some embodiments may further include a substrate support unit 170, i.e., a substrate supporter. The substrate support unit 170 may be installed inside the chamber 110. The substrate support unit 170 may be located below the processing space 120. The substrate support unit 170 may support the substrate 190.

The substrate support unit 170 may include an electrostatic chuck configured to support the substrate 190 by electrostatic force, and a chuck support that supports the electrostatic chuck. The electrostatic chuck may include electrodes for chucking and dechucking the substrate 190 therein. The chuck support supports the electrostatic chuck placed thereon, and may be formed of a metal, e.g., aluminum, or a ceramic insulator, e.g., alumina.

A heating member 171 that provides heat is placed inside the chuck support, and heat may be transferred from a heater 180 to the electrostatic chuck or the substrate 190. Also, power application wiring connected to the electrode of the electrostatic chuck may be placed on the chuck support. The configuration of the substrate support unit 170 is not limited thereto, e.g., the substrate support unit 170 may include a vacuum chuck configured to support the substrate 190 using a vacuum or may be configured to support the substrate 190 mechanically.

The substrate support unit 170 may include lift pins 175. The lift pins 175 may be configured to lift the substrate 190 from the surface of the substrate support unit 170 on which the substrate 190 sits. The lift pins 175 may be accommodated in holes provided in the substrate support unit 170. The lift pins 175 may be installed to be vertically movable with respect to the substrate support unit 170. The lift pins 175 may move vertically to raise and lower the substrate 190. The substrate support unit 170 may include lift pins 175 of any number suitable for supporting the substrate 190. For example, the substrate support unit 170 may include three or more lift pins 175 evenly spaced along the circumference of the substrate support unit 170.

When the substrate 190 to be processed is loaded into the substrate processing apparatus or unloaded from the substrate processing apparatus, the lift pins 175 may enter a pin-up state of protruding upward from the substrate support unit 170 to support the substrate 190. Also, the lift pins 175 may enter a pin-down state of being lowered downward from the upper surface of the substrate support unit 170 to allow the substrate 190 to be placed on the substrate support unit 170, while the substrate 190 is being processed inside the processing space 120.

An RF bias 150 may be connected to the substrate support unit 170. The RF bias 150 may apply RF power to the substrate support unit 170. In some embodiments, the RF bias 150 applies RF power of low frequency less than about 200 kHz to the substrate support unit 170 during the cleaning process, the deposition process or the etching processes on the substrate 190. In some embodiments, the RF bias 150 may remove RF power supplied to the substrate support unit 170 during the cleaning process, the deposition the or the etching processes on the substrate 190.

In some embodiments, the substrate support unit 170 may further include a rim 172. The rim 172 may be provided on the substrate support unit 170. The rim 172 may encase the substrate 190 placed on the substrate support unit 170. The rim 172 may prevent the substrate 190 from sliding on the substrate support unit 170. The rim 172 may include a ceramic material. Since the rim 172 includes a ceramic material, it may be vulnerable to a reactive stresses.

The heater 180 may be connected to the heating member 171 and heat the substrate support unit 170. The heater 180 may supply heat to the heating member 171 of the substrate support unit 170. The heater 180 may adjust the amount of heat supplied through the heating member 171 to adjust the temperature of the substrate support unit 170 and the temperature of the substrate 190 mounted on the substrate support unit 170.

Figure 5:
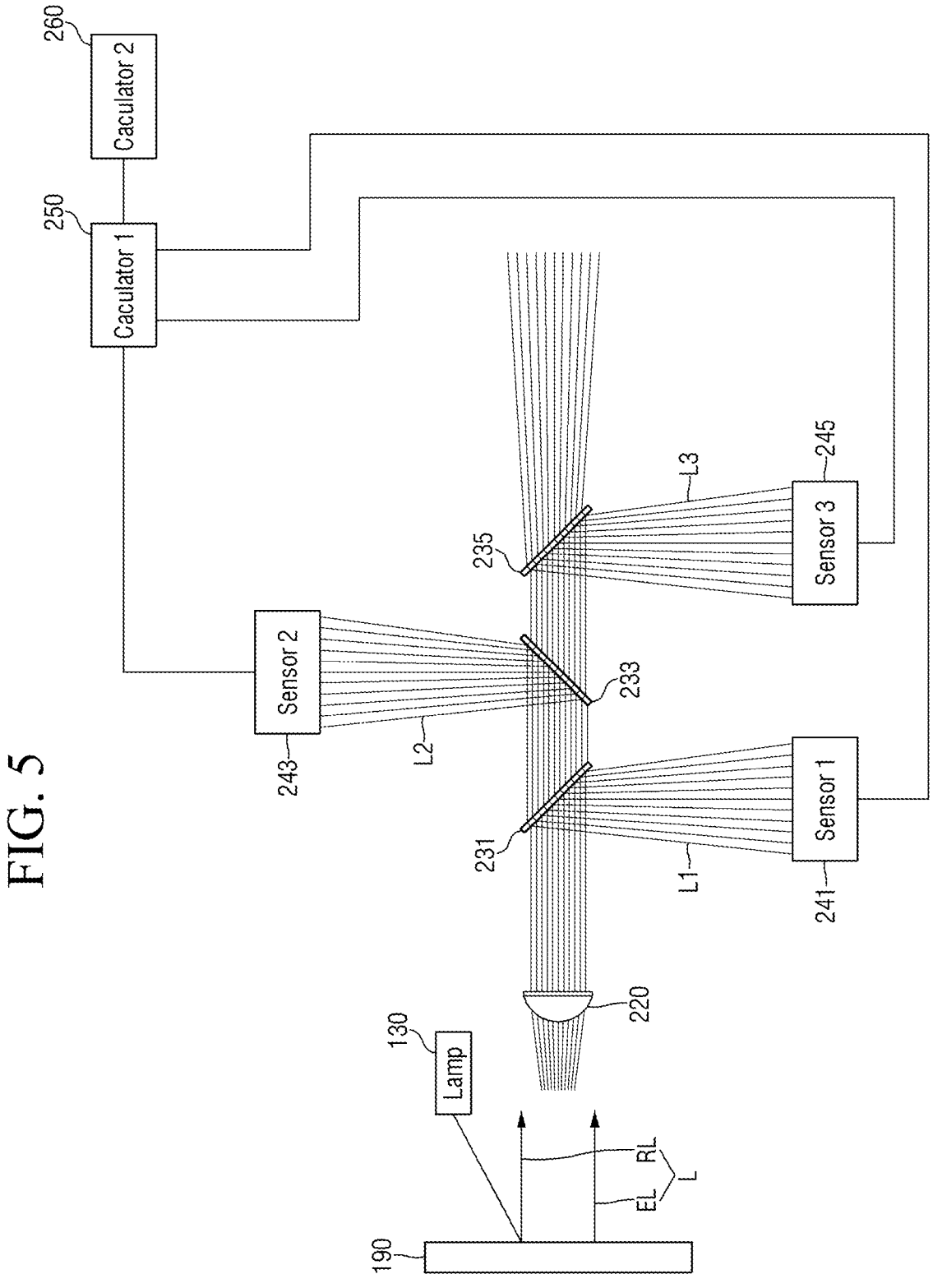
FIG. 5 is a schematic conceptual diagram of an operation of the substrate temperature measuring device according to some embodiments.

FIG. 5 is a schematic conceptual diagram for explaining the operation of the temperature measuring unit 200 according to some embodiments.

Referring to FIG. 5, the light L may be provided from the substrate 190. The light L may include emitted light EL and reflected light RL. The emitted light EL may be light emitted from the substrate 190 itself. The reflected light RL may be light reflected by the substrate 190. For example, the light provided from the light source 130 may be incident on the substrate 190, and the incident light reflected by the substrate 190 may be the reflected light RL.

The light L may be provided to the optical system 220 of the temperature measuring unit 200. The optical system 220 may not only control the direction of the light L to be constant, but also make the optical axis of the sensor unit 240 match the optical plane. Therefore, the temperature may be measured at one plane and one point of the substrate 190.

The light L may enter the splitter 230. The first light L1 may be separated by the first sub-splitter 231. The first light L1 may have a first wavelength. The second light L2 may be separated by the second sub-splitter 233. The second light L2 may have a second wavelength. The third light L3 may be separated by the third sub-splitter 235. The third light L3 may have a third wavelength. The first to third wavelengths may be wavelengths that are close to each other. Each of the first to third wavelengths may be 1 μm or more and 2 μm or less.

The sensor unit 240 may sense the amount of light L. For example, the first sub-sensor unit 241 may sense the first amount of light of the first light L1. The second sub-sensor unit 243 may sense the second amount of light of the second light L2. The third sub-sensor unit 245 may sense the third amount of light of the third light L3.

The first to third amounts of light are provided to the first calculation unit 250. The first calculation unit 250 calculates a first temperature for the first wavelength, a second temperature for the second wavelength, and a third temperature for the third wavelength through the sensed first to third amounts of light.

The second calculation unit 260 may calculate the emissivity of the substrate 190, the reflectivity of the substrate 190, and the reflected energy of the substrate 190, using the first temperature, the second temperature, and the third temperature calculated by the first calculation unit 250. Therefore, the temperature of the substrate 190 can be calculated.

Figure 6:
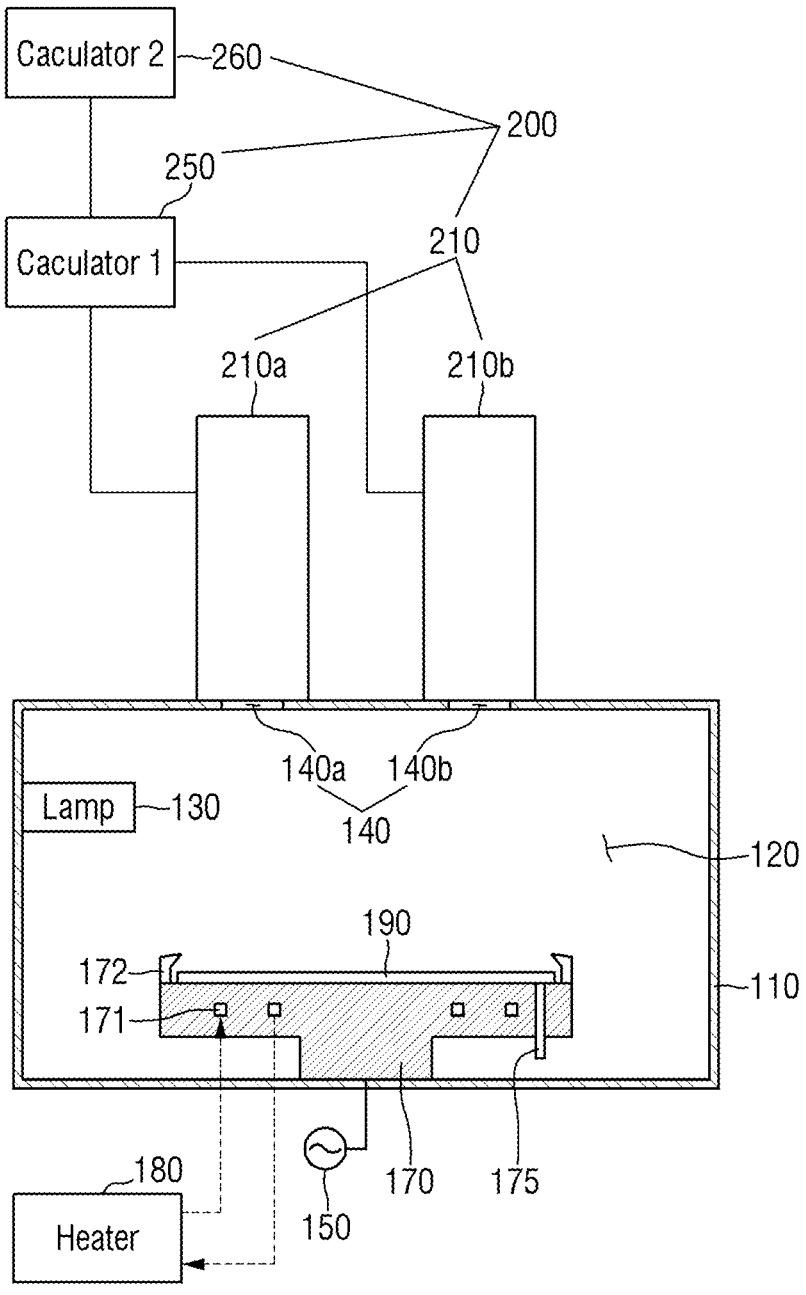
FIGS. 6 and 7 are diagrams of a substrate processing apparatus according to some embodiments.
Figure 7:
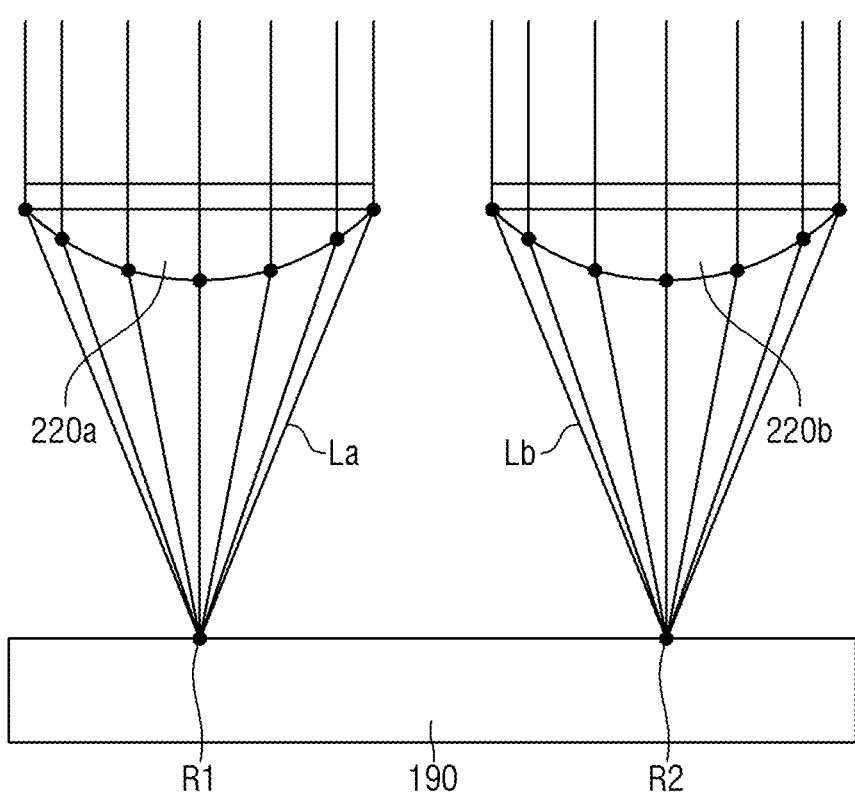

FIGS. 6 and 7 are diagrams of a substrate processing apparatus according to some embodiments. For convenience of explanation, the explanation will focus on points that are different from those explained using FIGS. 2 to 5.

Referring to FIGS. 6 and 7, the temperature measuring unit 200 according to some embodiments may include a first sub-measuring unit 210a and a second sub-measuring unit 210b. The transparent window 140 may include a first sub-transparent window 140a and a second sub-transparent window 140b.

The first sub-measuring unit 210a (i.e., a sub-measurer) may measure the temperature of a first region R1 of the substrate 190. The second sub-measuring unit 210b may measure the temperature of a second region R2 of the substrate 190.

As described above, the optical system 220 may make the optical axis of the sensor unit 240 match the optical plane. Therefore, the temperature at one point on one plane of the substrate 190 can be measured.

In detail, in FIG. 7, the substrate 190 may include the first region R1 and the second region R2. The optical system 220 may include a first sub-optical system 220a and a second sub-optical system 220b. The first sub-optical system 220a may collect the first sub-light La provided from the first region R1 of the substrate 190. The second sub-optical system 220b may collect the second sub-light Lb provided from the second region R2 of the substrate 190.

In other words, the light L provided from the substrate 190 may include the first side light La and the second side light Lb. The first sub-light La may be provided from the first region R1 of the substrate 190. The second sub-light Lb may be provided from the second region R2 of the substrate 190. The first sub-light La may enter through the first sub-transparent window 140a. The second sub-light Lb may enter through the second sub-transparent window 140b.

The first sub-light La may be separated into first to third lights having first to third wavelengths in the same manner as described above. The temperature of the first region R1 of the substrate 190 may be measured by sensing the amounts of light of the first to third lights. The second sub-light Lb may also be separated into first to third lights having first to third wavelengths in the same manner as described above. The temperature of the second region R2 of the substrate 190 may be measured by sensing the amounts of light of the first to third lights.

In this way, the substrate processing apparatus according to some embodiments may measure temperatures at various positions of the substrate 190 by including the first sub-measuring unit 210a and the second sub-measuring unit 210b.

Figure 8:
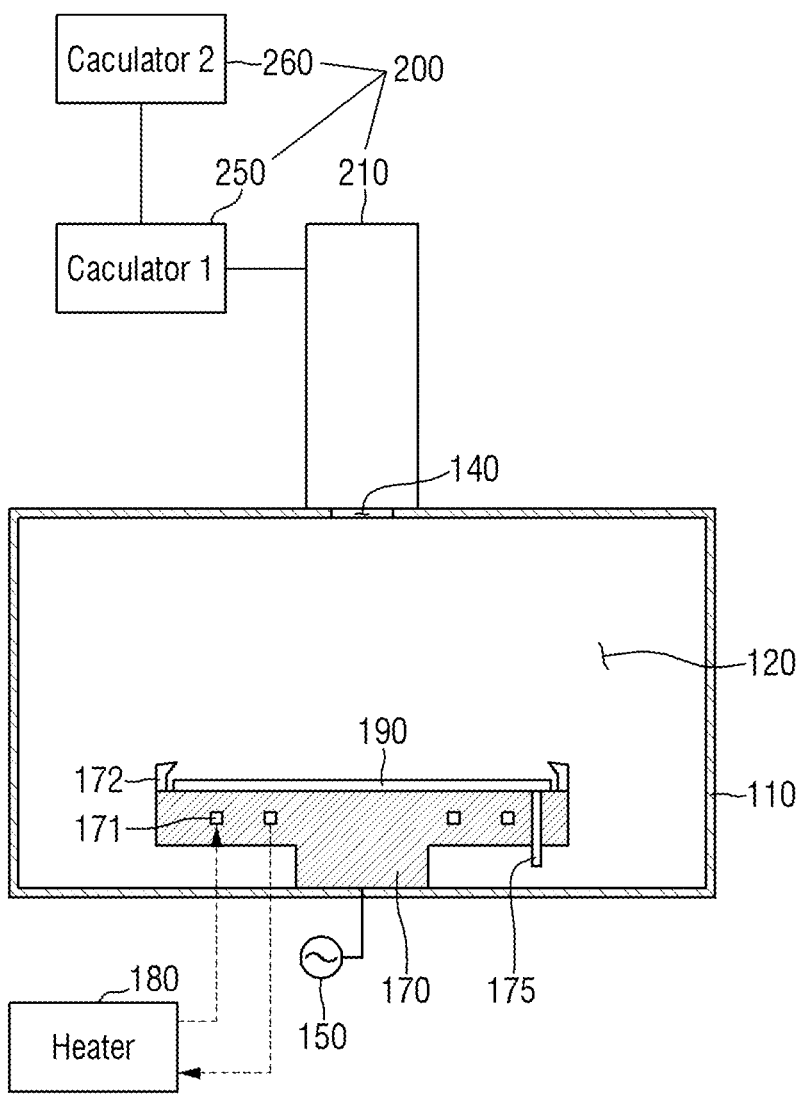
FIG. 8 is a diagram of a substrate processing apparatus according to some embodiments.

FIG. 8 is a diagram of a substrate processing apparatus according to some embodiments. For convenience of explanation, the explanation will focus on points that are different from those explained using FIGS. 2 to 5.

Referring to FIG. 8, the substrate processing apparatus according to some embodiments may not include the light source 130. Because the light source 130 is not included, the reflected light reflected by the substrate 190 may be determined by the internal conditions of the chamber 110, rather than being reflected by the light provided from the light source 130.

Figure 9:
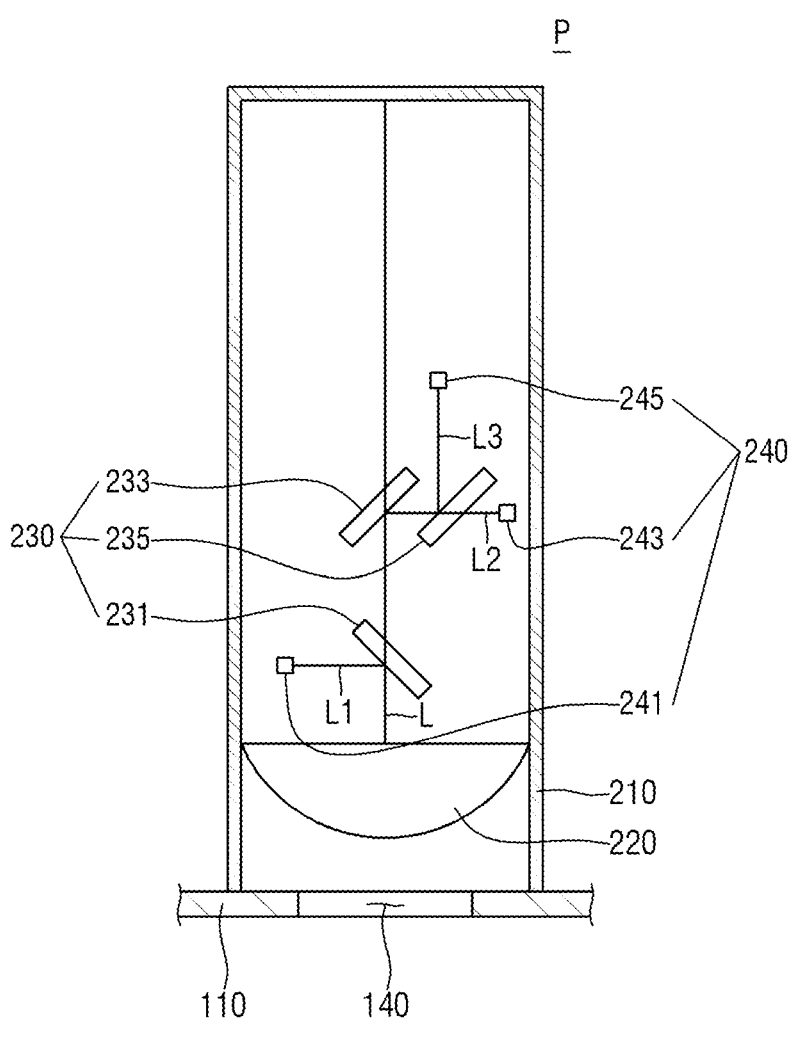
FIGS. 9 and 10 are diagrams of a temperature measuring unit according to some embodiments.
Figure 10:
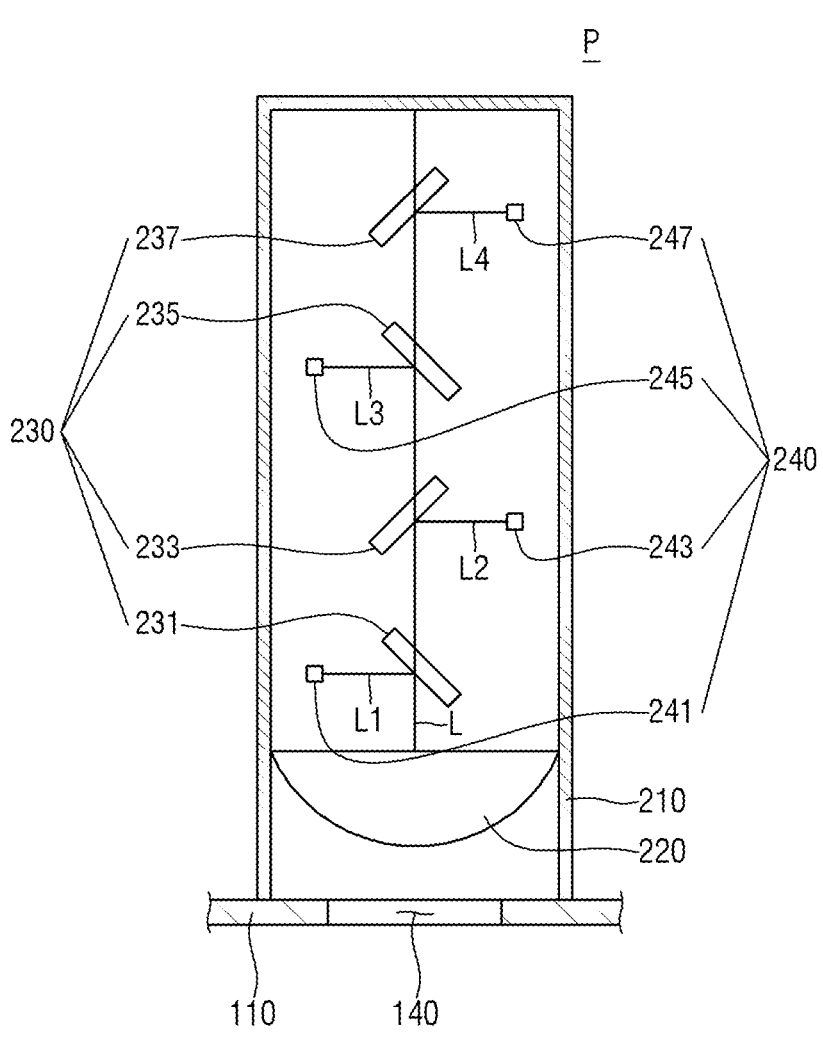

FIGS. 9 and 10 are diagrams of a temperature measuring unit according to some embodiments. For convenience of explanation, the explanation will focus on points that are different from those explained using FIGS. 2 to 5.

Referring to FIG. 9, the sub-splitters of the splitter 230 may not be arranged side by side in one direction. For example, the sub-splitters of the splitter 230 may be arranged in two directions.

For example, the first sub-splitter 231 and the second sub-splitter 233 may be arranged adjacent to each other in a first direction. The first sub-splitter 231 and the second sub-splitter 233 may be spaced apart from each other in the first direction. The second sub-splitter 233 and the third sub-splitter 235 may be arranged adjacent to each other in a second direction. The second sub-splitter 233 and the third sub-splitter 235 may be spaced apart from each other in the second direction. The first direction and the second direction may be substantially perpendicular to each other.

Therefore, when the light L is incident in the first direction, the first light L1 may be separated in the second direction. The second light L2 may be separated in the second direction. The third light L3 may be separated in the first direction.

The placement of the sub-splitters of the splitter 230 may vary depending on the design. The traveling directions of the first light L1, the second light L2, and the third light L3 may be changed depending on the placement of the sub-splitters of the splitter 230.

Referring to FIG. 10, the splitter 230 may include four or more sub-splitters. For example, the splitter 230 may include four sub-splitters.

The splitter 230 may include the first sub-splitter 231, the second sub-splitter 233, the third sub-splitter 235, and a fourth sub-splitter 237. For example, as illustrated in FIG. 10, the first sub-splitter 231, the second sub-splitter 233, the third sub-splitter 235, and the fourth sub-splitter 237 may be arranged side by side in one direction. In another example, the first sub-splitter 231, the second sub-splitter 233, the third sub-splitter 235, and the fourth sub-splitter 237 may be arranged in two directions. In the splitter 230, placement of the first sub-splitter 231, the second sub-splitter 233, the third sub-splitter 235, and the fourth sub-splitter 237 may be variously changed depending on the design.

The first sub-splitter 231 may separate the first light L1 having the first wavelength. The second sub-splitter 233 may separate the second light L2 having the second wavelength. The third sub-splitter 235 may separate the third light L3 having the third wavelength. The fourth sub-splitter 237 may separate a fourth light L4 having a fourth wavelength. The first to fourth wavelengths may be 1 μm or more and 2 μm or less. The first to fourth wavelengths may be wavelengths that are close to each other.

As further illustrated in FIG. 10, there may be four or more sensor units 240. For example, there may be four sensor units 240.

The sensor unit 240 may include the first sub-sensor unit 241, the second sub-sensor unit 243, the third sub-sensor unit 245 and a fourth sub-sensor unit 247. The first sub-sensor unit 241 may sense the first amount of light of the first light L1. The second sub-sensor unit 243 may sense the second amount of light of the second light L2. The third sub-sensor unit 245 may sense the third amount of light of the third light L3. The fourth sub-sensor unit 247 may sense the fourth amount of light of the fourth light L4. The first amount of light of the first light L1, the second amount of light of the second light L2, the third amount of light of the third light L3, and the fourth amount of light of the fourth light L4 that are sensed by the sensor unit 240 may be provided to the first calculation unit 250. The first calculation unit 250 may calculate temperatures for the first to fourth wavelengths on the basis of the sensed amount of light.

Figure 11:
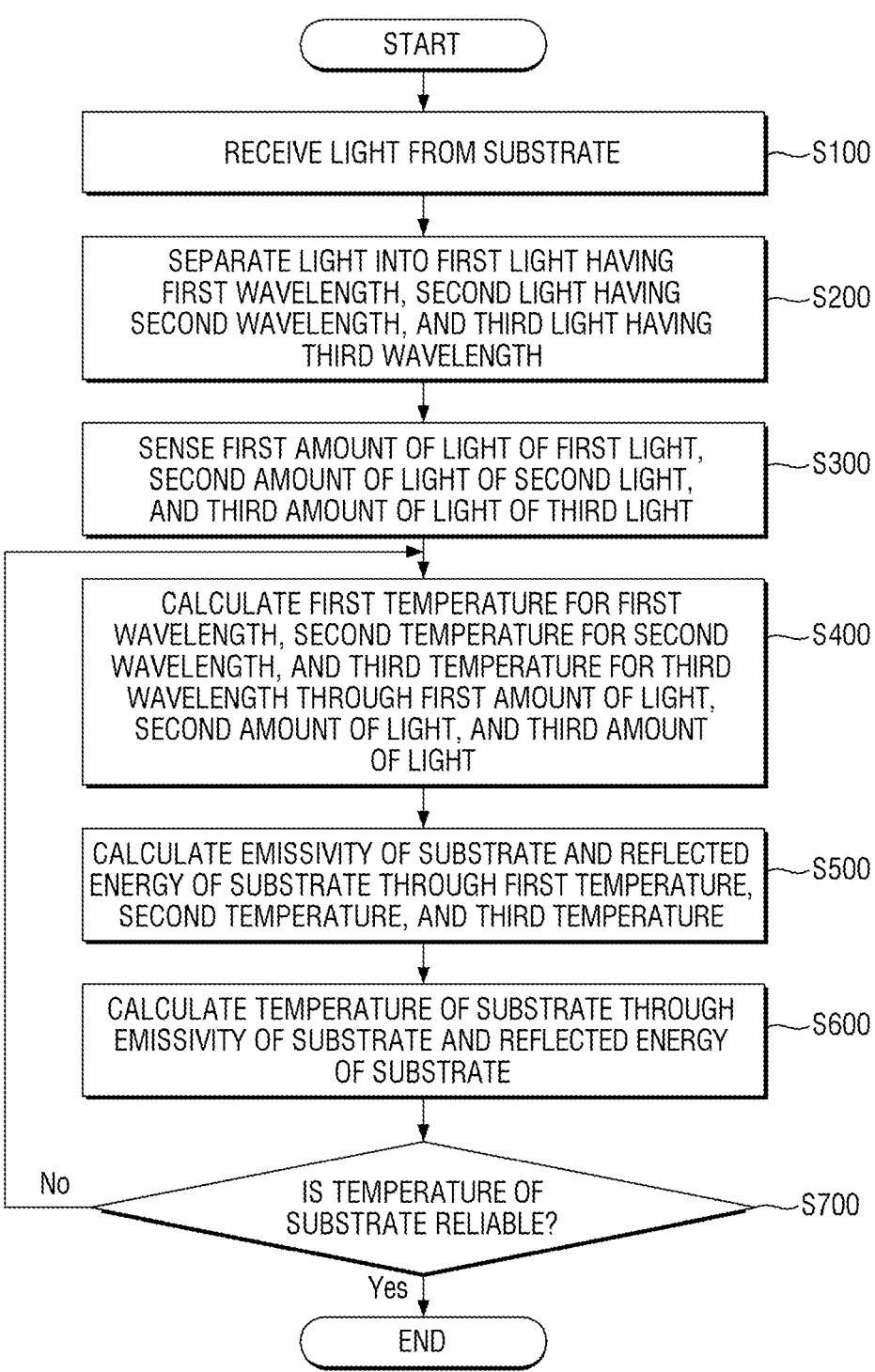
FIG. 11 is a flow chart of a substrate temperature measuring method according to some embodiments.

Hereinafter, a substrate temperature measuring method according to some embodiments will be described with reference to FIGS. 11 to 15. FIG. 11 is a flow chart for explaining the substrate temperature measuring method according to some embodiments. FIGS. 12 to 15 are diagrams for explaining the substrate temperature measuring method according to some embodiments.

Figure 12:
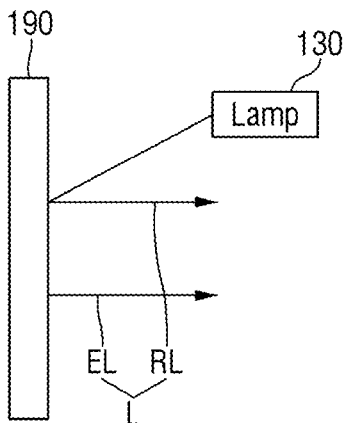
FIGS. 12 to 15 are diagrams of a substrate temperature measuring method according to some embodiments.
Figure 13:
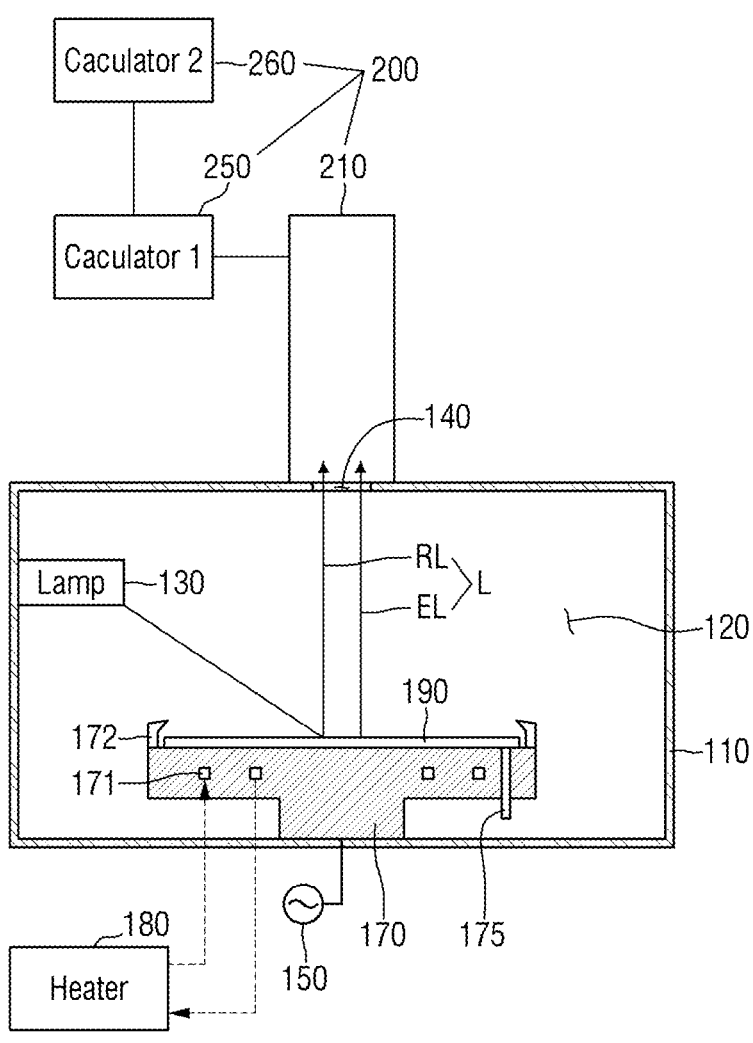

Referring to FIGS. 11 to 13, the light L may be provided from the substrate 190 (S100).

The light L may include emitted light EL and reflected light RL. The emitted light EL may be light emitted from the substrate 190 itself. The reflected light RL may be light which is emitted from the light source 130 and reflected by the substrate 190. The light L may be provided to the temperature measuring unit 200 through the transparent window 140. The emitted light EL and the reflected light RL may be provided to the temperature measuring unit 200 through the transparent window 140.

Figure 14:
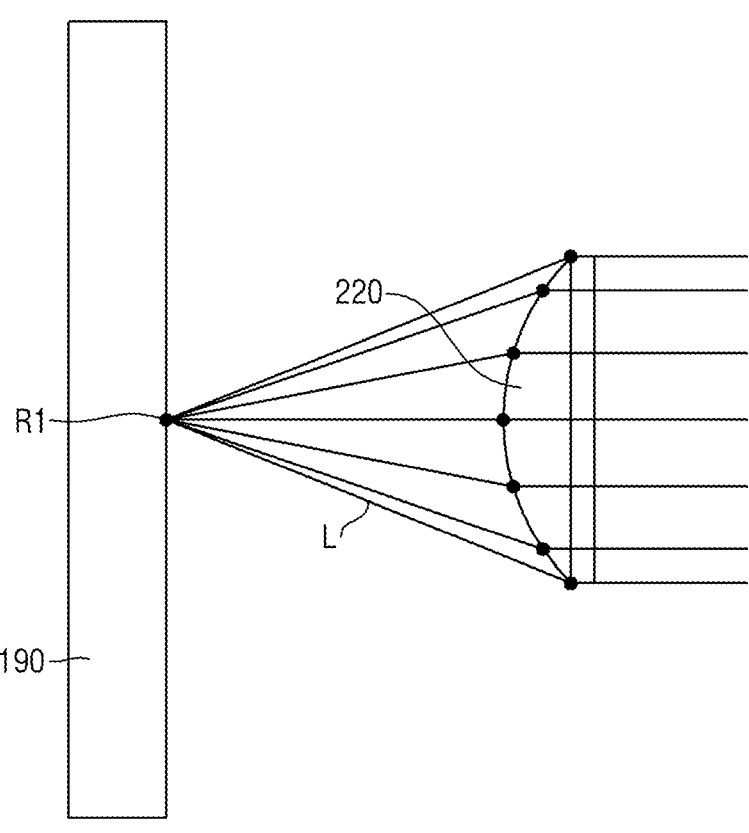

Referring to FIG. 14, the light L provided from the first region R1 of the substrate 190 is provided to the optical system 220. The optical system 220 may collect the light L. Further, the optical system 220 may make the optical axis of the sensor unit 240 match the optical plane.

Figure 15:
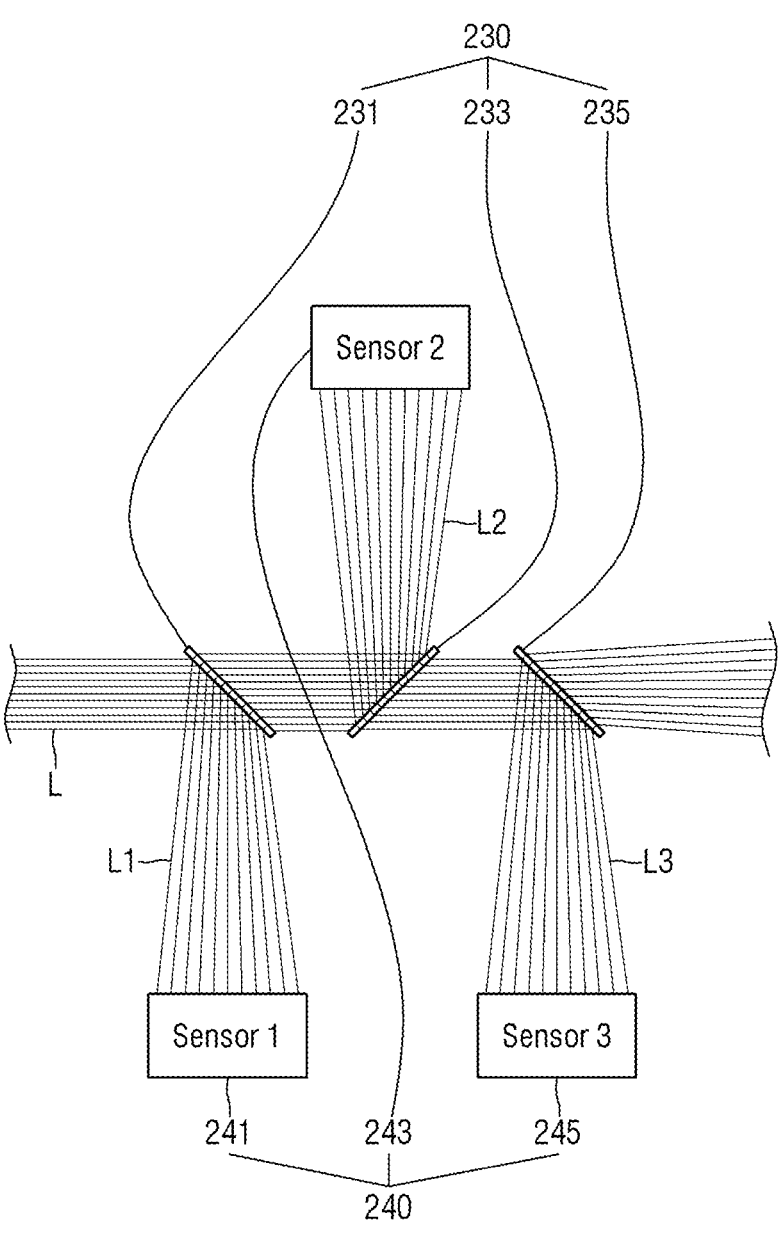

Referring to FIGS. 11 and 15, the light L may be separated into the first light L1 having the first wavelength, the second light L2 having the second wavelength, and the third light L3 having the third wavelength (S200).

The light L that has passed through the optical system 220 may be provided to the splitter 230. First, the light L that has passed through the optical system 220 may be provided to the first sub-splitter 231. The first sub-splitter 231 may separate the first light L1 having the first wavelength. Subsequently, the second sub-splitter 233 may separate the second light L2 having the second wavelength. The third sub-splitter 235 may separate a third light L3 having the third wavelength. The first to third wavelengths may be 1 μm or more and 2 μm or less.

Subsequently, the first amount of light of the first light L1, the second amount of light of the second light L2, and the third amount of light of the third light L3 may be sensed (S300).

The sensor unit 240 may sense the first amount of light of the first light L1, the second amount of light of the second light L2, and the third amount of light of the third light L3. The first sub-sensor unit 241 senses the first amount of light of the first light L1. The second sub-sensor unit 243 senses the second amount of light of the second light L2. The third sub-sensor unit 245 senses the third amount of light of the third light L3.

Next, the first temperature for the first wavelength, the second temperature for the second wavelength, and the third temperature for the third wavelength may be calculated through the first amount of light, the second amount of light, and the third amount of light (S400).

First, the sensed first to third amounts of light may be provided to the first calculation unit 250. The first calculation unit 250 calculates the first temperature for the first wavelength through the first amount of light. The first calculation unit 250 calculates the second temperature for the second wavelength through the second amount of light. The first calculation unit 250 calculates the third temperature for the third wavelength through the third amount of light.

The first temperature, the second temperature, and the third temperature may be calculated by Formula (1) above.

It is assumed that an object that provides light is a black body when the first calculation unit 250 calculates the temperature. At this time, the emissivity may be 1. That is, the first temperature, the second temperature, and the third temperature may be fixed values measured with a black body.

Next, the emissivity of the substrate 190 and the reflected energy of the substrate 190 may be calculated through, e.g., only, the calculated first temperature, second temperature, and third temperature (S500).

The calculated first temperature, second temperature, and third temperature may be provided to the second calculation unit 260. The second calculation unit 260 may calculate the emissivity of the substrate 190, the reflectivity of the substrate 190, and the reflected energy of the substrate 190 through the calculated first temperature, second temperature, and third temperature.

Specifically, the emissivity $\varepsilon$ of the substrate 190, the reflectivity $\rho_n$ of the substrate 190, and the reflected energy R of the substrate 190 may be calculated through the above Formula (2). The reflected energy R of the substrate 190 may be calculated on the basis of Planck radiation law.

Subsequently, temperature $T_w$ of the substrate may be calculated through the emissivity $\varepsilon$ of the substrate 190, the reflectivity $\rho_n$ of the substrate 190, and the reflected energy R of the substrate 190 (S600).

According to some embodiments, the first wavelength, the second wavelength, and the third wavelength may be wavelengths that are close to each other. Therefore, it may be assumed that all the emissivity for the first wavelength, the emissivity for the second wavelength and the emissivity for the third wavelength are the same. Accordingly, the variables of the Formula to be solved may decrease. Therefore, the temperature $T_w$ of the substrate can be efficiently calculated.

Next, it may be determined whether the calculated temperature of the substrate is reliable (S700). If the temperature is determined to be reliable, the substrate temperature measuring method ends. If the temperature is determined to be unreliable, calculation of the first calculation unit 250 and calculation of the second calculation unit 260 may be repeated.

By way of summation and review, aspects of the present disclosure provide a substrate temperature measuring device that measures the temperature of a substrate, using a plurality of wavelengths. Aspects of the present disclosure also provide a substrate processing apparatus and method that measure the temperature of a substrate, using a plurality of wavelengths.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate temperature measuring device, comprising:
a sensor configured to sense a first amount of light of a first light having a first wavelength, a second amount of light of a second light having a second wavelength, and a third amount of light of a third light having a third wavelength which are provided from a substrate;
a first calculator configured to calculate a first temperature for the first wavelength based on the first amount of light sensed by the sensor, a second temperature for the second wavelength based on the second amount of light sensed by the sensor, and a third temperature for the third wavelength based on the third amount of light sensed by the sensor, respectively; and
a second calculator configured to calculate an emissivity of the substrate and a reflected energy of the substrate, based on the first temperature, the second temperature, and the third temperature calculated by the first calculator, and to calculate a temperature of the substrate based on the calculated emissivity of the substrate and the calculated reflected energy of the substrate calculated by the second calculator,
wherein the first wavelength, the second wavelength, and the third wavelength are different from each other.

2. The substrate temperature measuring device as claimed in claim 1, wherein:
each of the first amount of light, the second amount of light, and the third amount of light includes an amount of emitted light emitted from the substrate and an amount of reflected light reflected from the substrate,
the amount of emitted light is determined by the emissivity of the substrate, and
the amount of reflected light is determined by the reflected energy of the substrate.

3. The substrate temperature measuring device as claimed in claim 1, wherein the first temperature, the second temperature, and the third temperature are fixed values corresponding to temperatures of a black body.

4. The substrate temperature measuring device as claimed in claim 1, further comprising an optical system configured to adjust an optical axis of the sensor to match an optical plane.

5. The substrate temperature measuring device as claimed in claim 1, wherein the reflected energy of the substrate is calculable on the basis of a Planck radiation law.

6. The substrate temperature measuring device as claimed in claim 1, wherein the temperature of the substrate is calculated by repeating calculation performed by the first calculator and calculation performed by the second calculator.

7. The substrate temperature measuring device as claimed in claim 1, wherein the first wavelength, the second wavelength, and the third wavelength are different from each other and are 1 µm or more and 2 µm or less.

8. The substrate temperature measuring device as claimed in claim 1, wherein:
the sensor includes a first sub-sensor configured to sense the first amount of light, a second sub-sensor configured to sense the second amount of light, and a third sub-sensor configured to sense the third amount of light.

9. The substrate temperature measuring device of claim 8, wherein:
received light comprising the first light, the second light, and the third light is incident to the substrate temperature measuring device in a first direction, and
the first sub-sensor is spaced apart from the second sub-sensor along the first direction.

10. The substrate temperature measuring device as claimed in claim 1, further comprising:

a transparent window positioned between the substrate and the sensor, wherein the sensor is disposed on a side of the transparent window opposite to the substrate; and a splitter positioned between the transparent window and the sensor and configured to separate received light into the first light, the second light, and the third light so that the sensor receives the first light, the second light, and the third light from the splitter.

11. The substrate temperature measuring device of claim 10, further comprising a body portion completely covering the transparent window and enclosing a space including the sensor and the splitter, wherein the space enclosed by the body portion is free of any light source.

12. The substrate temperature measuring device of claim 1, wherein the second calculator is configured to calculate the reflected energy of the substrate based only on the first temperature, the second temperature, and the third temperature calculated by the first calculator.

13. A substrate temperature measuring device, comprising:

a chamber which defines a processing space for processing a substrate;

a temperature measurer positioned on an upper wall of the chamber and outside of the chamber, the temperature measurer being configured to measure a temperature of the substrate and comprising a first sub-measurer and a second sub-measurer spaced apart from each other; and a light source on an inner wall of the chamber and inside of the chamber, the light source being configured to emit a light, wherein each of the first sub-measurer and the second sub-measurer includes:

a sensor configured to sense a first amount of light of a first light having a first wavelength, a second amount of light of a second light having a second wavelength, and a third amount of light of a third light having a third wavelength, which are provided from the substrate, the first wavelength, the second wavelength, and the third wavelength being different from each other and each being 1 μm or more and 2 μm or less, an optical system configured to adjust light received from the substrate so that its optical plane is aligned with an optical axis of the sensor, wherein the light from the substrate comprises the first light, the second light, and the third light, a first calculator configured to calculate a first temperature for the first wavelength, a second temperature for the second wavelength, and a third temperature for the third wavelength, based on the first amount of light, the second amount of light, and the third amount of light, a second calculator configured to calculate an emissivity of the substrate and a reflected energy of the substrate, based on the first temperature, the second temperature, and the third temperature, and to calculate a temperature of the substrate, based on the calculated emissivity of the substrate and the calculated reflected energy of the substrate, a transparent window positioned between the substrate and the sensor, wherein the sensor is disposed on a side of the transparent window opposite to the substrate, a splitter configured to separate received light into the first light, the second light, and the third light so that the sensor is positioned to receive the first light, the second light, and the third light from the splitter, and a body portion enclosing the sensor, the splitter, and the transparent window, wherein each of the first amount of light, the second amount of light and the third amount of light include an amount of emitted light emitted from the substrate and an amount of reflected light reflected from the substrate, wherein the amount of emitted light is determined by the emissivity of the substrate, wherein the amount of reflected light is determined by the reflected energy of the substrate, wherein the first sub-measurer is configured to measure a temperature of a first region of the substrate, wherein the second sub-measurer is configured to measure a temperature of a second region different from the first region of the substrate, and wherein the first wavelength, the second wavelength, and the third wavelength are different from each other.

14. The substrate temperature measuring device as claimed in claim 13, wherein the first temperature, the second temperature, and the third temperature are fixed values measured with a black body.

15. The substrate temperature measuring device as claimed in claim 13, wherein the reflected energy of the substrate is calculable on the basis of a Planck radiation law.

16. The substrate temperature measuring device as claimed in claim 13, wherein the temperature of the substrate is calculated by repeating calculation performed by the first calculator and calculation performed by the second calculator.

17. A substrate temperature measuring device comprising:

a sensor configured to sense a first amount of light of a first light having a first wavelength, a second amount of light of a second light having a second wavelength, and a third amount of light of a third light having a third wavelength which are provided from a substrate;

a first calculator configured to calculate a first temperature for the first wavelength, a second temperature for the second wavelength, and a third temperature for the third wavelength, based on the first amount of light, the second amount of light, and the third amount of light sensed by the sensor;

a second calculator configured to calculate an emissivity of the substrate and a reflected energy of the substrate, based on the first temperature, the second temperature, and the third temperature calculated by the first calculator, and to calculate a temperature of the substrate based on the emissivity of the substrate and the reflected energy of the substrate calculated by the second calculator, an optical system configured to adjust received light from the substrate so that its optical plane is aligned with an optical axis of the sensor; and a splitter configured to separate a main light from the optical system into the first light, the second light, and the third light, wherein the temperature of the substrate is calculated by repeating calculation performed by the first calculator and calculation performed by the second calculator, and wherein the first wavelength, the second wavelength, and the third wavelength are different from each other and are 1 μm or more and 2 μm or less, and wherein the sensor includes a first sub-sensor configured to sense the first amount of light, a second sub-sensor configured to sense the second amount of light, and a third sub-sensor configured to sense the third amount of light, the first sub-sensor being spaced apart in a first direction along an incident direction of the main light comprising the first light, the second light, and the third light.

18. The substrate temperature measuring device as claimed in claim 17, wherein:

each of the first to third amounts of light includes an amount of emitted light emitted from the substrate and an amount of reflected light reflected from the substrate, the amount of emitted light is determined by the emissivity of the substrate, and the amount of reflected light is determined by reflected energy of the substrate.

19. The substrate temperature measuring device as claimed in claim 17, wherein the first temperature, the second temperature, and the third temperature are fixed values measured with a black body.

20. The substrate temperature measuring device of claim 17, further comprising a body portion enclosing a space including the sensor, the optical system, and the splitter, wherein the enclosed space is free of any light source.

\* \* \* \* \*